United States Patent
Conway et al.

(10) Patent No.: US 9,215,808 B2
(45) Date of Patent: Dec. 15, 2015

(54) MOTHERBOARD WITH CONNECTOR FOR EXTENDER

(75) Inventors: Ralph W. Conway, Saratoga, CA (US); Samuel Chau, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 783 days.

(21) Appl. No.: 13/146,646

(22) PCT Filed: Jan. 31, 2009

(86) PCT No.: PCT/US2009/032763
§ 371 (c)(1),
(2), (4) Date: Jul. 27, 2011

(87) PCT Pub. No.: WO2010/087860
PCT Pub. Date: Aug. 5, 2010

(65) Prior Publication Data
US 2011/0279988 A1   Nov. 17, 2011

(51) Int. Cl.
| | |
|---|---|
| H05K 5/00 | (2006.01) |
| H05K 5/04 | (2006.01) |
| H05K 5/06 | (2006.01) |
| H05K 1/14 | (2006.01) |
| G06F 13/40 | (2006.01) |

(52) U.S. Cl.
CPC ............ *H05K 1/142* (2013.01); *G06F 13/409* (2013.01); *H05K 2201/044* (2013.01); *H05K 2201/09145* (2013.01); *H05K 2201/10189* (2013.01); *Y10T 29/49126* (2015.01)

(58) Field of Classification Search
USPC .......... 361/678, 752, 807–810, 756–759, 803
See application file for complete search history.

(56) References Cited

U.S. PATENT DOCUMENTS

| | | | |
|---|---|---|---|
| 4,862,400 A | 8/1989 | Selbrede | |
| 5,338,214 A | 8/1994 | Steffes et al. | |
| 5,734,840 A | 3/1998 | Chew et al. | |
| 6,477,603 B1 | 11/2002 | Locker et al. | |
| 6,639,806 B1 | 10/2003 | Chuang et al. | |
| 7,046,511 B2 | 5/2006 | McClure et al. | |
| 7,174,407 B2 | 2/2007 | Hou et al. | |
| 2002/0119682 A1 | 8/2002 | Schmid | |
| 2004/0003154 A1 | 1/2004 | Harris et al. | |
| 2005/0120153 A1* | 6/2005 | Perez et al. | 710/62 |
| 2006/0238991 A1 | 10/2006 | Drako | |
| 2007/0130404 A1* | 6/2007 | Huang et al. | 710/100 |
| 2008/0022028 A1 | 1/2008 | Yin | |
| 2008/0104297 A1 | 5/2008 | Lu | |

OTHER PUBLICATIONS

WIPO, International Search Report, dated Oct. 20, 2009, PCT/US2009/032763 filed Jan. 31, 2009.

* cited by examiner

*Primary Examiner* — Tuan T Dinh
(74) *Attorney, Agent, or Firm* — Hewlett-Packard Patent Department

(57) ABSTRACT

A motherboard has a cut-away so that it deviates from its rectangular outline. The motherboard has a connector disposed along one side for physically and electrically connecting the motherboard to a motherboard extender. A method includes physically and electrically connecting a motherboard extender to a motherboard so that a tab of said motherboard extender and an overlapping expansion-card connector extend into the cut-away.

12 Claims, 3 Drawing Sheets

MOTHERBOARD WITH CONNECTOR FOR EXTENDER

BACKGROUND

When it comes to motherboard form factors, one size does not suit all. For example, there is an ATX form factor (with motherboard dimensions of 12"×9.6", 30.5 cm×24.4 cm) and a micro-ATX form factor (with motherboard dimensions of 9.6"×9.6", 24.4 cm×24.4 cm). The full ATX form factor provides for greater component count and thus expandability, while the micro-ATX form factor provides for a more compact assembled system. One advantage of this particular pair of form factors is that they share port placements so that a micro-ATX motherboard can be used in a case designed for a full ATX motherboard.

DETAILED DESCRIPTION

While it is possible to use an extender that adds PCIe expansion card slots to a micro-ATX motherboard, it can be difficult to achieve the number of slots that a full ATX motherboard can provide. One embodiment addresses this by including a tab on an extender that accommodates an extra expansion card connector. The tab conforms to a complementary cut-away on the motherboard, to provide an extended motherboard with an increased expansion board connector count. This cut-away is entirely within the outline of the micro-ATX board, so that the board can be used in standard micro-ATX chassis. Herein, a "cut-away" is a deviation by a perimeter to the interior of a rectangle that best fits the perimeter, in this case of the motherboard.

From the manufacturer's point of view, one motherboard form factor, e.g., micro-ATX needs to be supplied, rather than two motherboard form factors, e.g., micro-ATX and full ATX, thus consolidating manufacturing and reducing manufacturing costs. In addition design and qualifying times are reduced, further reducing costs and time-to-market. The micro-ATX motherboard can be extended to meet the full ATX expansion card connector count. Other embodiments permit extensions for other form factors.

Figure 1:
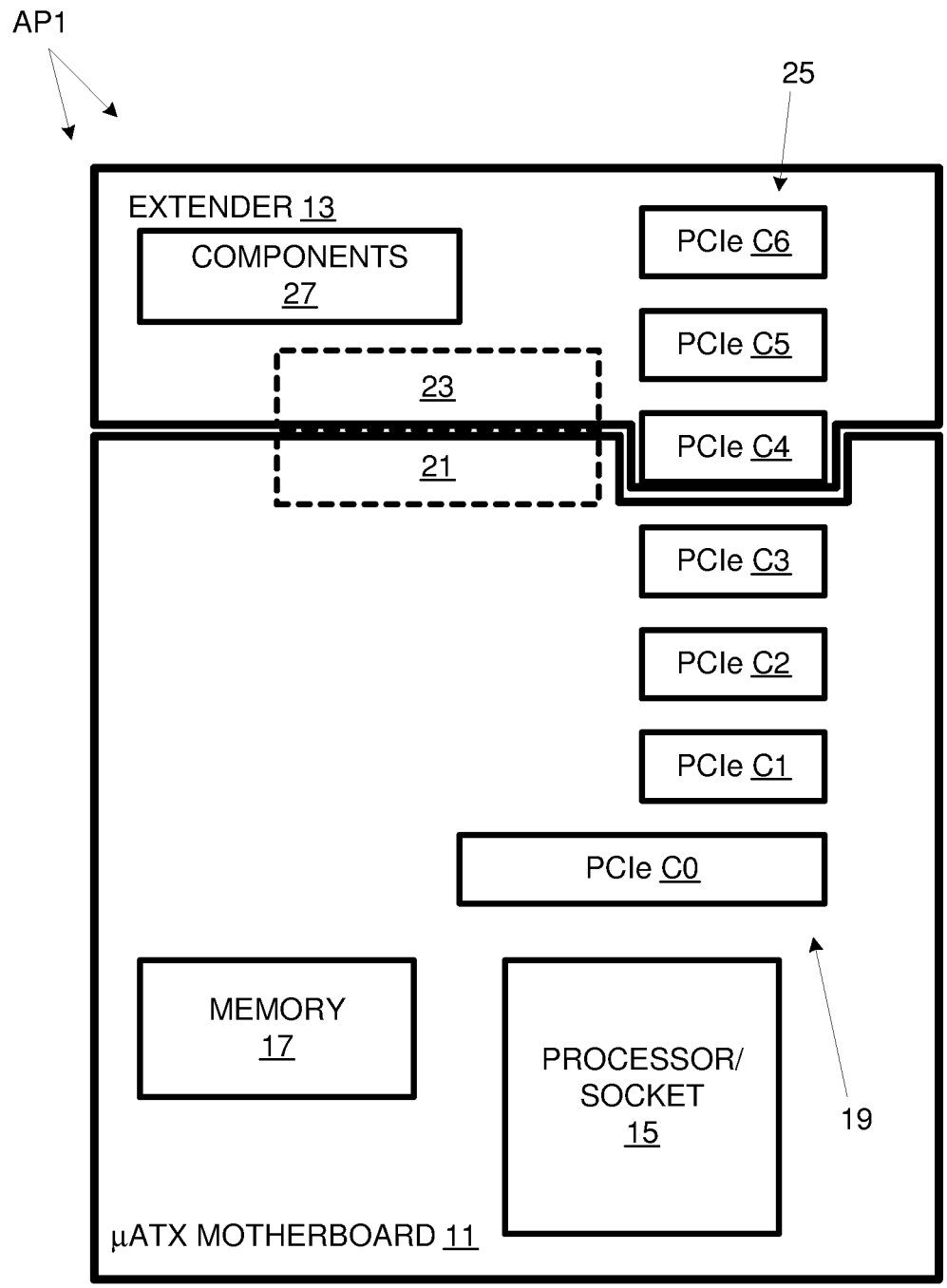
FIG. 1 is a schematic diagram of a motherboard assembly in accordance with an embodiment of the invention.

A motherboard assembly AP1 is shown in FIG. 1 including a micro-ATX motherboard 11 and a motherboard extender 13. The assembly conforms to the full ATX form factor. Motherboard 11 bears various computer components including a combination processor and processor socket 15, and memory 17. In addition, the motherboard 11 has mounted thereon a series of PCIe expansion card connectors 19; series 19 includes full-length PCIe connector C0 and three shorter PCIe connectors C1-C3. The motherboard 11 also includes an extender connector 21 to be used when the extender 13 is to be connected.

The motherboard extender 13 includes a printed-circuit board 22 and a motherboard connector 23, designed to engage the extender connector 21 so that the motherboard 11 and the extender 13 can be physically and electrically connected. The extender 13 also bears a series 25 of three PCIe slots C4-C6 and other components 27 designed to extend the capabilities of the motherboard when the extender is attached. The dimensions of motherboard extender 13 correspond to the difference between an AIX form factor and a micro-ATX form factor.

Figure 2:
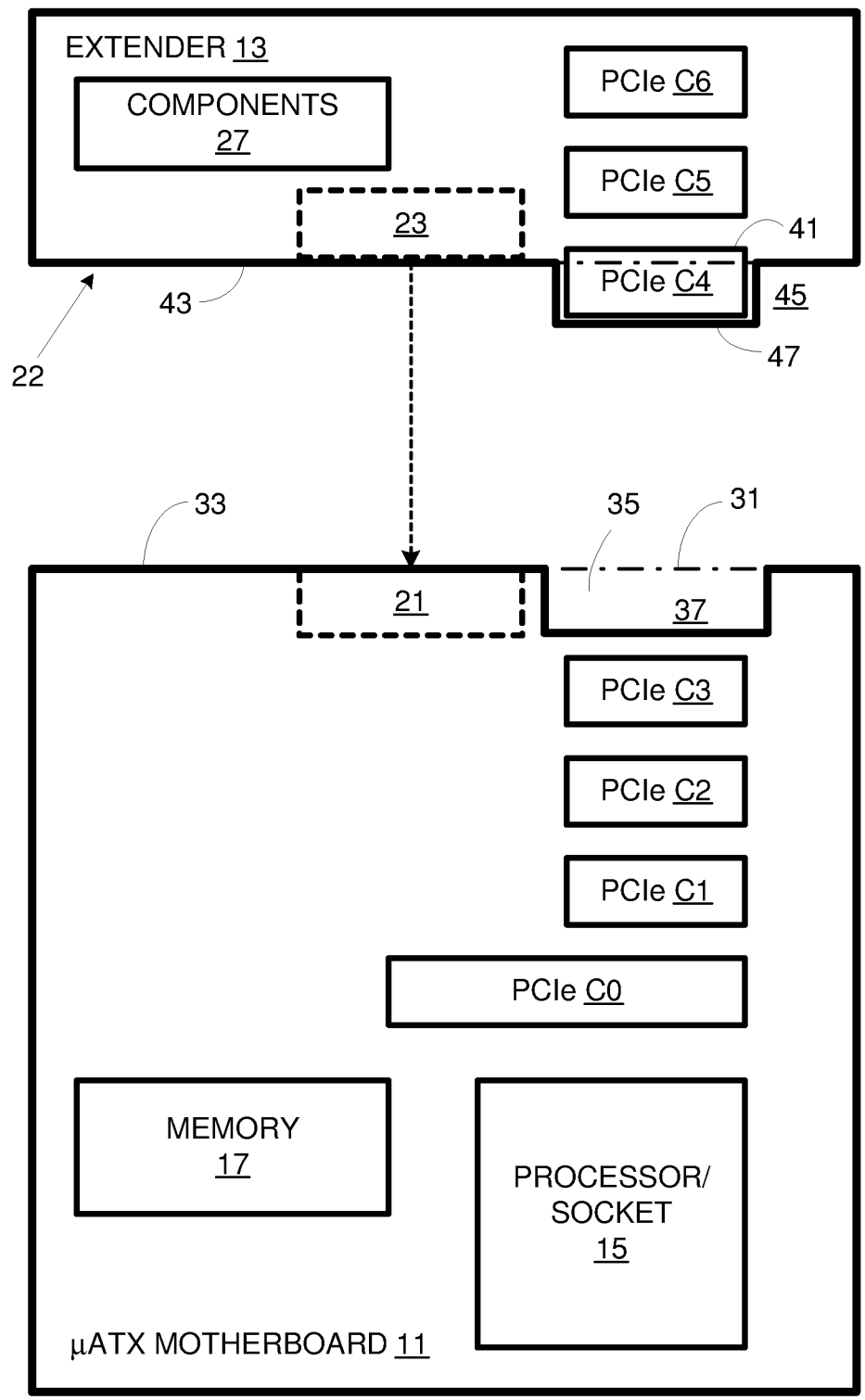
FIG. 2 is a schematic diagram of a motherboard and an extender that, when engaged, form the motherboard assembly of FIG. 1.

The motherboard 11 and the Extender 13 are shown separated in FIG. 2. Motherboard 11 defines a "best-fit" rectangular motherboard outline 31, which substantially conforms to the perimeter of the motherboard 11, but deviates along a first side 33 of motherboard 11, as indicated by a dot-dash line. Motherboard 11 has a "cut-away" ("recess" or "notch") 35 in the region of this deviation to the interior 37 of outline 31.

Motherboard extender 13 defines a "best-fit" rectangular extender outline 41, which is represented by a dot-dash line where it deviates from the perimeter of extender 13. The deviation occurs along a first side 43 of the extender 13. In this case, the deviation is to the exterior 45 of extender outline 41. The deviation to the exterior defines a tab 47. The shape of tab 47 is complementary to the shape of cut-away 35 so that they conform to each other when the extender 13 engages the motherboard 11.

PCIe connector C4 is mounted on the extender 13 so that it overlaps the tab 47. Herein, "overlap" means that the orthogonal projection of an object (in this case PCIe connector C4) intersects a target (in this case, tab 47). Having the PCIe connector C4 on the tab 47 permits it to be disposed over the boundary of motherboard outline 31 and extender outline 41 when the extender 13 is connected to the motherboard 11. Without this complementary arrangement between cut-away 35 and tab 47, the boundary between outlines 31 and 41 could be a dead zone for expansion-card connectors. In other words, the illustrated arrangement allows seven rather than six PCIe connectors. The extra PCIe connector can be a competitive factor in the market place and a substantial asset to a well-provisioned computer.

Figure 3:
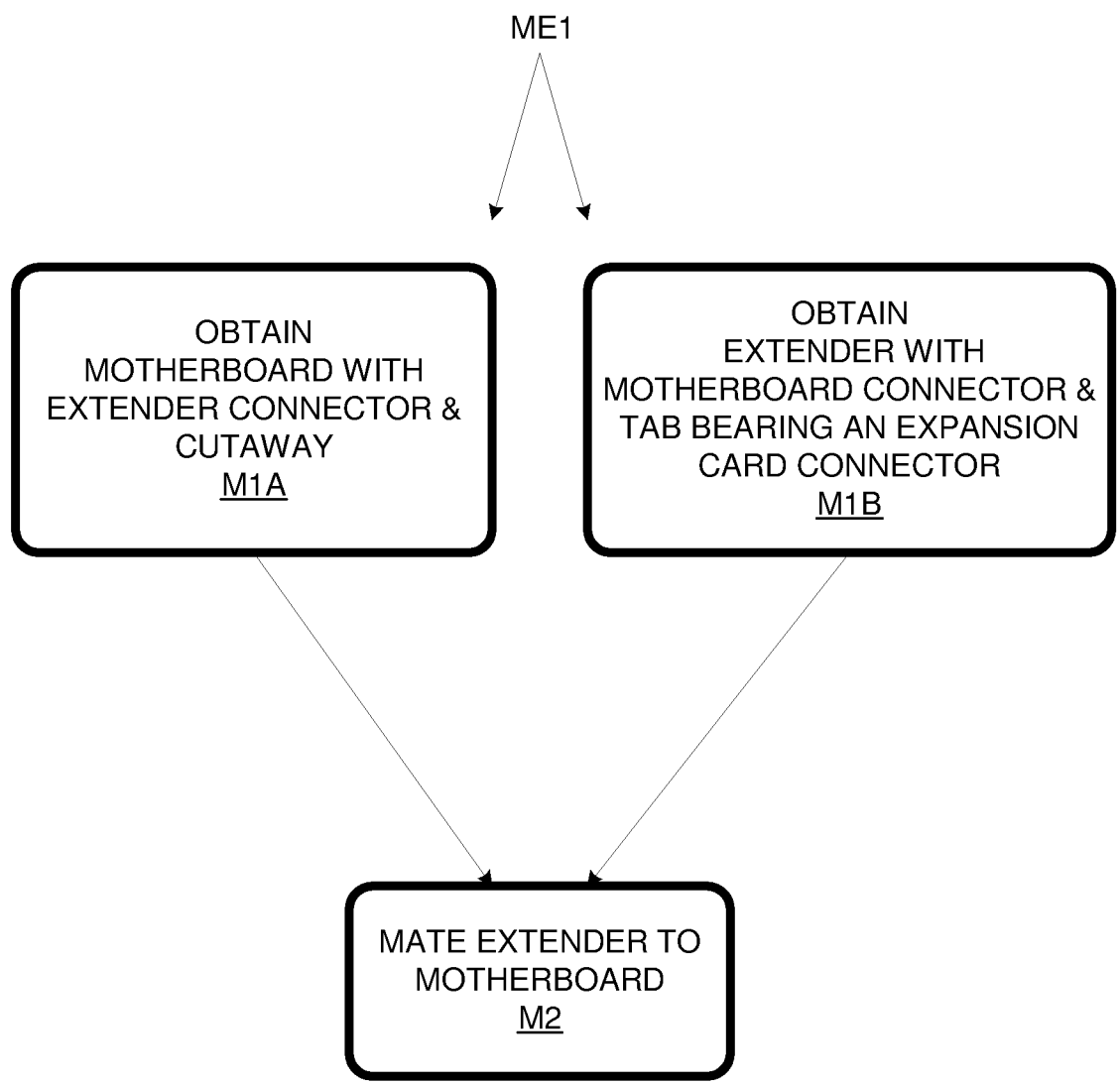
FIG. 3 is a method in accordance with an embodiment of the invention.

A method ME1 in accordance with an embodiment of the invention is flow charted in FIG. 3. At method segment M1A, a motherboard such as the motherboard 11 of FIGS. 1 and 2 is obtained. At method segment M1B, a motherboard extender such as the extender 13 of FIGS. 1 and 2 is obtained. At method segment M2, the extender is physically and electrically connected to the motherboard 11 to form motherboard assembly AP1 (FIG. 1).

Method segment M2 involves mechanically and electrically engaging the motherboard connector 23 and the extender connector 21. This connection extends the PCIe bus (not shown) on motherboard 11 to service PCIe connectors C4-C6 on extender 13. Also, the components 27 on the extender 13 are communicatively coupled to the motherboard 11. These components can include a USB hub, mini-card slot, an eSata port, etc. These and other variations upon and modifications to the illustrated embodiment are provided for by the following claims.

What is claimed is:
1. A motherboard structure comprising:
   a motherboard having a rectangular shape, a first side of the motherboard having a cut-away, the cut-away being a rectangular recess inward into the first side;
   one of either a processor or a processor socket attached to the motherboard;
   a first series of elongated expansion-card connectors, said series extending perpendicular to the first side of the motherboard, the expansion-card connectors extending parallel to the first side;

a motherboard extender having a rectangular shape, a first side of the motherboard extender equal in length to the first side of the motherboard, having a rectangular tab protruding outward; and an extender connector on the motherboard disposed along the first side of the motherboard that engages with a motherboard connector on the motherboard extender disposed along the first side of the motherboard extender for physically and electrically connecting the motherboard to the motherboard extender, wherein at least one expansion card connector of a second series of expansion card connectors is mounted on the rectangular tab of the motherboard extender, wherein the extender connector and the motherboard connector are not placed on the same location as the rectangular tab on the motherboard extender or the cut-away on the motherboard; and wherein the rectangular tab on the motherboard extender is complementary in shape to the cut-away on the motherboard such that the motherboard extender conforms to the motherboard when connected.

2. The motherboard structure of claim 1, wherein the motherboard conforms to a micro-ATX form factor and the motherboard and the motherboard extender, when connected, collectively conform to an ATX form factor.

3. The motherboard structure of claim 1, wherein the second series of expansion-card connectors is perpendicular to the first side of the motherboard extender and aligned with the first series of expansion-card connectors when the motherboard is connected to the motherboard extender.

4. The motherboard structure of claim 1, wherein the first series of expansion card connectors and the second series of expansion card connectors, collectively include seven PCIe connectors.

5. The motherboard structure of claim 1, wherein the cut-away deviates from a best-fit rectangular outline of the motherboard, the best-fit rectangular outline being one that substantially conforms to a perimeter of the motherboard.

6. The motherboard structure of claim 4, wherein at least three of the seven PCIe connectors are on the motherboard extender.

7. A method of connecting a motherboard structure comprising:

physically and electrically connecting a rectangular-shaped motherboard to a rectangular-shaped motherboard extender with a first side equal in length to a first side of the motherboard, by:

connecting a first extender connector on the motherboard disposed along the first side of the motherboard that engages with a motherboard connector on the motherboard extender disposed along the first side of the motherboard extender, wherein the first side of the motherboard includes a cut-away, the cut-away being a rectangular recess inward into the first side and the first side of the motherboard extender includes a rectangular tab protruding outward, wherein the extender connector and the motherboard connector are not placed on the same location as the rectangular tab on the motherboard extender or the cut-away on the motherboard; and wherein the rectangular tab on the motherboard extender is complementary in shape to the cut-away on the motherboard such that the motherboard extender conforms to the motherboard when connected.

8. The method of claim 7, wherein the motherboard includes a first set of expansion card connectors, the first set lined perpendicular to the first side of the motherboard and the expansion card connectors extending parallel to the first side of the motherboard.

9. The method of claim 7, wherein the motherboard conforms to a micro-ATX form factor and the motherboard and the motherboard extender, when connected, collectively conform to an ATX form factor.

10. The method of claim 7, wherein the cut-away deviates from a best-fit rectangular outline of the motherboard, the best-fit rectangular outline being one that substantially conforms to a perimeter of the motherboard.

11. The method of claim 8, wherein the motherboard extender includes a second set of expansion card connectors, the second set lined perpendicular to the first side of the motherboard extender and aligned with the first set of expansion-card connectors when the motherboard is connected to the motherboard extender.

12. The method of claim 11, wherein at least one expansion card connector of the second set of expansion card connectors is mounted on the rectangular tab of the motherboard extender.

* * * * *